United States Patent
Ishii et al.

(10) Patent No.: US 7,687,850 B2
(45) Date of Patent: Mar. 30, 2010

(54) SEMICONDUCTOR DEVICE

(75) Inventors: Yasushi Ishii, Tokyo (JP); Takashi Hashimoto, Tokyo (JP); Koichi Toba, Tokyo (JP); Yoshiyuki Kawashima, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 26 days.

(21) Appl. No.: 11/785,103

(22) Filed: Apr. 13, 2007

(65) Prior Publication Data

US 2007/0278564 A1 Dec. 6, 2007

(30) Foreign Application Priority Data

May 30, 2006 (JP) ............................. 2006-149773

(51) Int. Cl.
*H01L 29/792* (2006.01)
(52) U.S. Cl. ..................... 257/325; 257/324; 257/314; 257/E29.309
(58) Field of Classification Search ................ 257/314, 257/320, 324, E29.309, 315, 21.68
See application file for complete search history.

(56) References Cited

U.S. PATENT DOCUMENTS

| 7,259,422 B1 * | 8/2007 | Hisamoto et al. | ........... 257/316 |
| 2003/0067030 A1 * | 4/2003 | Torii | ........................ 257/315 |
| 2005/0285181 A1 * | 12/2005 | Yasui et al. | .................. 257/315 |
| 2007/0215930 A1 * | 9/2007 | Machida et al. | ............. 257/314 |

FOREIGN PATENT DOCUMENTS

| JP | 2002-231829 A | | 8/2002 |
| JP | 2005-64178 A | | 3/2005 |
| JP | 2006-067088 | * | 3/2006 |

* cited by examiner

*Primary Examiner*—Sue Purvis
*Assistant Examiner*—William Harriston
(74) *Attorney, Agent, or Firm*—Miles & Stockbridge P.C.

(57) ABSTRACT

This invention is to improve data retention properties of a nonvolatile memory cell having an ONO film. A first cavity is disposed, in a position between the nitride film serving as a charge storage film and a memory gate and below an end portion of the memory gate, adjacent to the upper oxide film. A second cavity is disposed, in a position between the nitride film and a substrate and below an end portion of the memory gate, adjacent to the bottom oxide film. These cavities are closed with sidewall spacers formed over the substrate along the sidewalls of the memory gate.

29 Claims, 12 Drawing Sheets

SEMICONDUCTOR DEVICE

CROSS-REFERENCE TO RELATED APPLICATIONS

The disclosure of Japanese Patent Application No. 2006-149773 filed on May 30, 2006 including the specification, drawings and abstract is incorporated herein by reference in its entirety.

BACKGROUND OF THE INVENTION

The present invention relates to a semiconductor device, particularly, a technology effective when applied to a semiconductor device equipped with a nonvolatile memory having an ONO (Oxide Nitride Oxide) film.

There is a semiconductor device having, over one semiconductor chip (semiconductor substrate), a memory, a peripheral circuit for driving the memory, and a logic circuit. Examples of the memory formed in this semiconductor device include a volatile memory that retains data only when power is turned ON and a nonvolatile memory that retains data even when power is turned OFF. The nonvolatile memory is, for example, EEPRPM (Electrically Erasable Programmable Read Only Memory) which can electrically write and erase data.

In Japanese Unexamined Patent Publication No. 2002-231829, a nonvolatile memory (memory cell) having a first gate electrode formed on the surface of a channel region via a first insulating film and a second gate electrode formed over both the side walls of the first gate electrode via a second insulating film is disclosed. In this nonvolatile memory, when a predetermined potential is supplied to the first gate electrode and a certain memory cell is selected, by the control of a potential to be supplied to an impurity region (semiconductor region) and a second gate electrode, charges are accumulated independently in an insulating film below the second gate electrode and are read out.

In Japanese Unexamined Patent Publication No. 2005-64178, a nonvolatile memory cell having an MONOS transistor for memory and an MIS transistor for cell selection is disclosed. In this nonvolatile memory cell, when the MIS transistor for cell selection is turned ON and a certain memory cell is selected, programming is carried out by applying a predetermined voltage to an impurity region and a gate electrode of the MONOS transistor.

SUMMARY OF THE INVENTION

A nonvolatile memory has a memory cell for storing 1 bit of data as a unit and is formed of a memory array in which a number of memory cells have been arranged two-dimensionally. Each memory cell has a memory transistor composed of an MONOS (Metal Oxide Nitride Oxide Semiconductor) transistor for memory and a control transistor composed of an MIS (Metal Insulator Semiconductor) transistor for control.

A fragmentary cross-sectional view of a semiconductor device equipped with a nonvolatile memory which has been investigated by the present inventors is shown in FIG. 23. The memory cell MC0 shown in FIG. 23 has a control gate 3, a gate insulating film 2, an ONO film 124, a memory gate 7, sidewall spacers 12, a pair of lightly-doped semiconductor regions 22d and 22s, and a pair of heavily-doped semiconductor regions 23d and 23s. It should be noted that the control gate 3 and memory gate 7 constitute a split gate.

In this memory cell MC0, the control gate 3 is formed, via the gate insulating film 2, over, for example, a p well (not illustrated) of the main surface of a semiconductor substrate (which will hereinafter be called "substrate" simply) 1 made of, for example, a p type single crystal silicon substrate. The ONO film 124 is formed of two parts, that is, one part formed over one of the sidewalls of the control gate 3 and the other part formed over the main surface of the substrate 1. This ONO film 124 has a top oxide film 106, a nitride film 105 and a bottom oxide film 104 disposed in the order of mention from the side of the memory gate 7. The nitride film 105 is a charge storage film and it accumulates therein charges from the substrate 1 when a voltage is applied to the memory gate 7 or the like.

The memory gate 7 is formed over the one of the sidewalls of the control gate 3 and is electrically isolated from the control gate 3 via the one part of the ONO film 124 and at the same time, is electrically isolated from the substrate 1 via the other part of the ONO film 124.

The sidewall spacers 12 are formed over the other sidewall of the control gate 3 and one of the sidewalls of the memory gate 7 and they are split gate type sidewall spacers 12. The sidewall spacers 12 are formed by etching back an insulating film such as silicon oxide film deposited over the split gate. By these sidewall spacers 12, a certain distance is kept between a silicide film (not illustrated) formed on the surfaces of the heavily-doped semiconductor regions 23d and 23s and a pn junction, whereby a leakage current at the pn junction is prevented.

Moreover, for example, a pair of $n^-$ type lightly-doped semiconductor regions 22d and 22s are formed in the surface of the substrate 1 with one end of them being placed in the vicinity of the control gate 3, and constitute extension regions for forming an LDD (Lightly Doped Drain) structure. For example, a pair of $n^+$ type heavily-doped semiconductor regions 23d and 23s are formed in the surface of the substrate 1 with one end of them being placed in the vicinity of the sidewall spacer 12 on the side of the control gate 3, and constitute source and drain regions.

In a nonvolatile memory formed of such a memory cell MC0, each of program, erase and read operations on the selected memory cell MC0 is performed by applying a predetermined voltage to the memory gate 7, control gate 3 or the like. In other words, information is stored, depending on the presence or absence of charges accumulated in the nitride film 105 serving as a charge storage film of each memory cell MC0.

Owing to the movement of accumulated charges from the nitride film 105 serving as a charge storage film to the memory gate 7 as illustrated in FIG. 23 by the symbol I1, a reduction in data retention properties may sometimes occur. Similarly, owing to the movement of accumulated charges from the nitride film 105 serving as a charge storage film to the substrate 1 as illustrated by the symbol I2, a reduction in data retention properties may sometimes occur. This phenomenon of a reduction in data retention properties is presumed to occur also in the memory cell disclosed in the above-described Japanese Unexamined Patent Publication No. 2002-231829. Described specifically, in the structure of the second electrode formed over the substrate via an insulating film in the memory cell of this document, a reduction in data retention properties is presumed to occur because charges are accumulated independently in the insulating film and at the same time, they are read out so that accumulated charges migrate from the insulating film to the second electrode or semiconductor substrate.

As illustrated in FIG. 23 by the symbol I3, application of a predetermined voltage to the memory gate 7 or the like may sometimes cause a leakage current between the memory gate 7 and substrate 1 along the side surface (surface on the side of the sidewall spacer) of the other part of the ONO film 124. This phenomenon of a leakage current is presumed to occur also in the memory cell disclosed in the above-described Japanese Unexamined Patent Publication No. 2002-231829.

As illustrated in FIG. 23 by the symbol I4, application of a predetermined voltage to the memory gate 7 or the like may sometimes cause a leakage current between the memory gate 7 and control gate 3 along the side surface of the one part of the ONO film 124. In addition, a silicide film which is not illustrated in FIG. 23 is formed on the surfaces of the memory gate 7 and control gate 3 in order to reduce the resistance of them. A short circuit between the memory gate 7 and control gate 3 may sometimes occur, depending on the growth of this silicide film. This means that as shown by the symbol I4, short-circuit current may sometimes appear between the memory gate 7 and control gate 3. In order to prevent such a phenomenon, a difference in height is provided between the memory gate 7 and control gate 3 as the structure of the memory cell described in the above-described Japanese Unexamined Patent Publication No. 2002-231829. A decrease in the height of the memory gate 7 relative to that of the control gate 3, however, leads to a decrease in the height of the sidewall spacer 12 formed over the side surface of the memory gate 7 by etchback and also a decrease in the length of the sidewall spacer 12 along the surface of the substrate 1. This may sometimes result in the appearance of a leakage current at the pn junction as described above. This phenomenon of a leakage current is also described in the above-described Japanese Unexamined Patent Publication No. 2005-64178.

An object of the present invention is to provide a technology capable of improving the data retention properties of a nonvolatile memory having an ONO film.

The above-described and the other objects and novel features of the present invention will be apparent from the description herein and accompanying drawings.

Outlines of the representative inventions, of the inventions disclosed by the present applications, will next be described briefly.

In the present invention, there is thus provided a nonvolatile memory having a memory gate structure formed over a semiconductor substrate via an ONO film composed of a top oxide film, a nitride film and a bottom oxide film, wherein a cavity is disposed, in a position which is between the nitride film and the memory gate and at the same time is below the end of the memory gate, adjacent to the top oxide film.

Advantages available from the typical inventions, of the inventions disclosed by the present application, will next be described briefly.

The present invention makes it possible to improve the data retention properties of a nonvolatile memory having an ONO film.

DETAILED DESCRIPTION OF THE INVENTION

Figure 1:
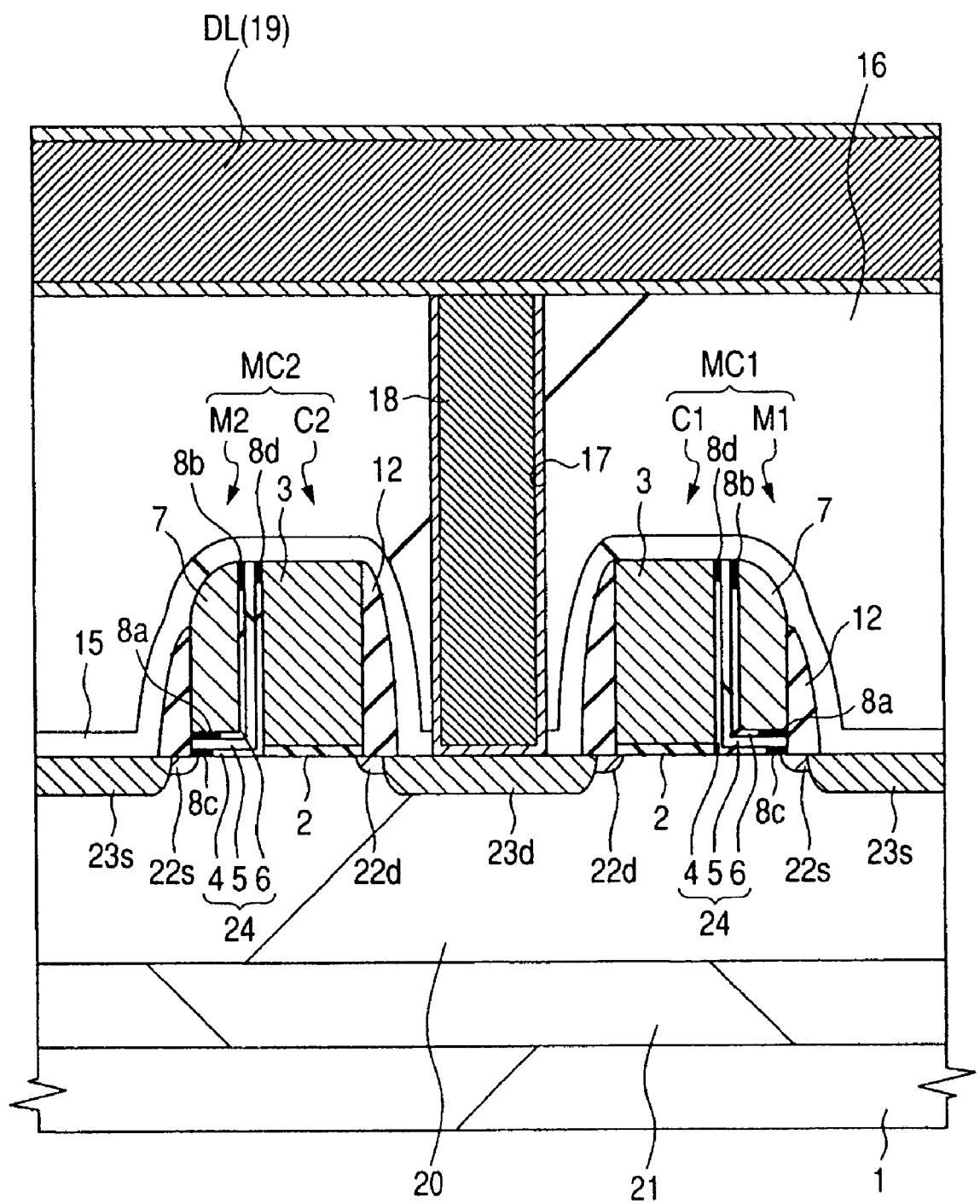
FIG. 1 is a fragmentary cross-sectional view schematically illustrating a semiconductor device according to Embodiment 1 of the present invention.

Embodiments of the present invention will hereinafter be described based on accompanying drawings. In all the drawings for describing the below-described embodiments, members having like function will be identified by like reference numerals and overlapping descriptions will be omitted.

Embodiment 1

The semiconductor device according to Embodiment 1 of the present invention is equipped with a nonvolatile memory having a split gate memory cell structure with an ONO (Oxide Nitride Oxide) film composed of a bottom oxide film, a nitride film and a top oxide film. The nitride film of this ONO film serves as a film accumulating charges therein (charge storage film).

Figure 2:
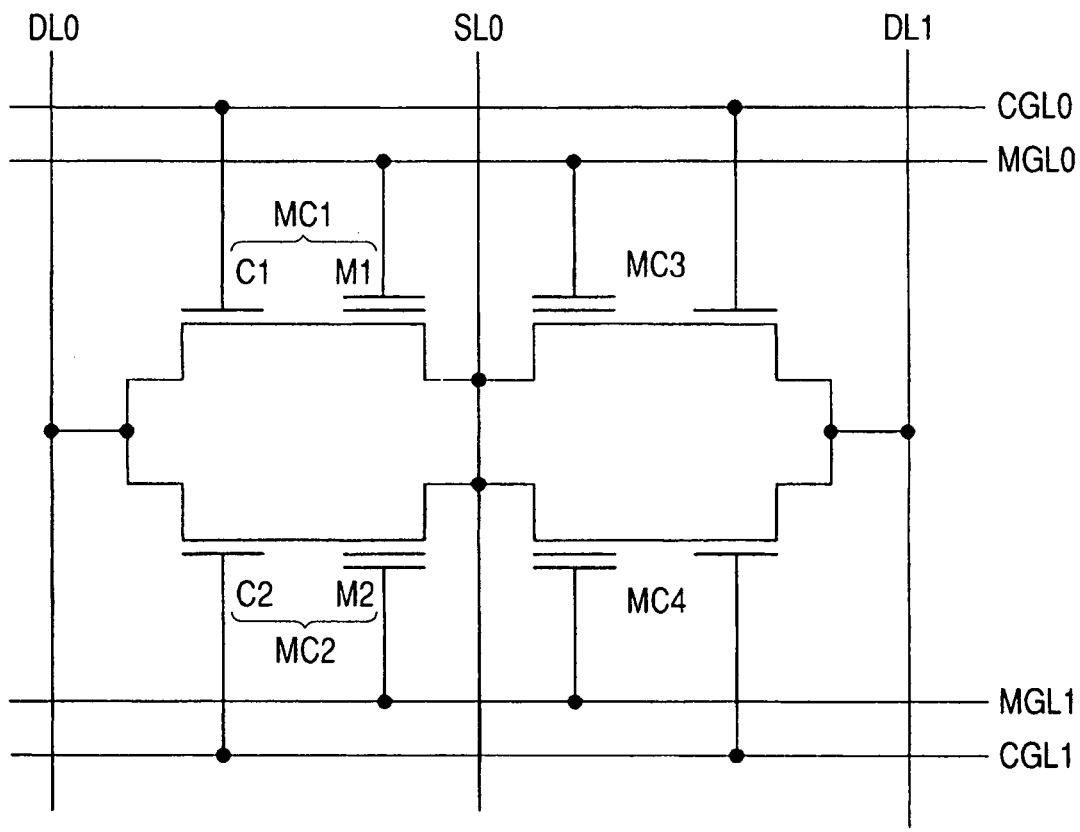
FIG. 2 is an equivalent circuit diagram including the nonvolatile memory of FIG. 1.

FIG. 1 is a fragmentary cross-sectional view illustrating the nonvolatile memory of this Embodiment and FIG. 2 is an equivalent circuit diagram including the nonvolatile memory of FIG. 1. In FIGS. 1 and 2, two memory cells (MC1 and MC2) placed adjacent to each other are illustrated and to facilitate explanation, a portion of the nonvolatile memory is omitted from these diagrams.

The memory cell MC1 of the nonvolatile memory is formed over a p well 20 over a semiconductor substrate (which will hereinafter be called "substrate" simply) 1 made of a p type single crystal silicon substrate. The p well 20 is electrically isolated from the substrate 1 via an n buried layer 21 for well isolation so that a desired voltage can be applied to the p well.

The memory cell MC1 is composed of a control transistor C1 and a memory transistor M1. The gate electrode (control gate 3) of the control transistor C1 is made of an n type polysilicon film and is formed over a gate insulating film 2 made of a silicon oxide film. The gate electrode (memory gate 7) of the memory transistor Ml is made of an n type polysilicon film and is arranged over one of the sidewalls of the control gate 3. This memory gate 7 is electrically isolated from the control gate 3 and substrate 1 via an ONO film 24 having an L-shaped cross-section and composed of one part formed over one of the sidewalls of the control gate 3 and the other part formed over the substrate 1 (well 20).

The ONO film 24 is formed by disposing a top oxide film 6, a nitride film 5 and a bottom oxide film 4 successively in the order of mention from the side of the memory gate 7. The top oxide film 6, nitride film 5 and bottom oxide film 4 can be formed of, for example, a silicon oxide film, a silicon nitride film and a silicon oxide film, respectively. Upon data programming, hot electrons generated in a channel region are injected into the ONO film 24 and are caught by a trap in the nitride film 5. A cavity 8a is placed, in a position which is between the nitride film 5 and the memory gate 7 and at the same time below the end of the memory gate 7, adjacent to the top oxide film 6 of the other part of the ONO film 24. A cavity 8c is placed, in a position which is between the nitride film 5 and the substrate 1 and at the same time below the end of the memory gate 7, adjacent to the bottom oxide film 4 of the other part of the ONO film 24. A cavity 8b is placed, in a position which is between the nitride film 5 and memory gate 7 and at the same time over the upper side surface of the memory gate 7, adjacent to the top oxide film 6 of the one part of the ONO film 24. A cavity 8d is placed, in a position which is between the nitride film 5 and the control gate 3 and at the same time over the upper side surface of the control gate 3, adjacent to the bottom oxide film 4 of the one part of the ONO film 24. In FIG. 1, the cavities 8a, 8b, 8c and 8d are shown while being blacked out.

In the well 20 in the vicinity of the control gate 3, an n+ type heavily-doped semiconductor region 23d functioning as a drain region of the memory cell MC1 is formed, while in the well 20 in the vicinity of the memory gate 7, an n+ type heavily-doped semiconductor region 23s functioning as a source region of the memory cell MC1 is formed. In the p well 20 in a region adjacent to the n+ type heavily-doped semiconductor region (drain region) 23d, an n− type lightly-doped semiconductor region 22d having a lower impurity concentration than the heavily-doped semiconductor region 23d is formed. The lightly-doped semiconductor region 22d is an extension region for relaxing the high electric field at the end of the heavily-doped semiconductor region (drain region) 23d and imparting the control transistor C1 with an LDD (Lightly Doped Drain) structure. In the well 20 in a region adjacent to the n+ type heavily-doped semiconductor region (source region) 23s, an n− type lightly-doped semiconductor region 22s having a lower impurity concentration than the n+ type heavily-doped semiconductor region 23s is formed. The lightly-doped semiconductor region 22d is an extension region for relaxing the high electric field at the end of the heavily-doped semiconductor region (source region) 23s and imparting the memory transistor M1 with an LDD structure.

A sidewall spacer 12 made of an insulating film is formed over the other sidewall of the control gate 3 and the one of the sidewalls of the memory gate 7. These sidewall spacers 12 are utilized for the formation of the heavily-doped semiconductor region (drain region) 23d and heavily-doped semiconductor region (source region) 23s. The sidewall spacer 12 made of an insulating film formed over the substrate 1 along the sidewall of the memory gate 7 also plays a role of closing the cavity 8a therewith. The sidewall spacer 12 also plays a role of closing the cavity 8c therewith.

A data line DL is formed above the memory cell MC1 via a protective film 15 and an interlayer insulating film 16. The data line DL is electrically coupled to the heavily-doped semiconductor region (drain region) 23d via a contact plug 18 in a connecting hole 17 formed above the heavily-doped semiconductor region (drain region) 23d. The data line DL is made of a metal film having an aluminum alloy as a main component, while the contact plug 18 is made of a metal film having tungsten as a main component.

As illustrated in FIG. 2, the control gate 3 of the control transistor C1 is coupled to a control gate line CGL0, while the memory gate 7 of the memory transistor M1 is coupled to a memory gate line MGL0. The source region 23s is coupled to a source line SL0 and a desired voltage is applied to the well 20 through a power wire which is not illustrated.

The memory cell MC2 adjacent to the memory cell MC1 has the same structure as that of the MC1 and has the drain region 23d in common with the memory cell MC1. As described above, this drain region 23d is coupled to the data line DL0. These two memory cells MC1 and MC2 are arranged symmetrically with the common drain region 23d therebetween. A control gate 3 of the control transistor C2 is coupled to a control gate line CGL1, while a memory gate 7 of a memory transistor M2 is coupled to a memory gate line MGL1. A source region 10s is coupled to the source line SL0.

A memory cell 3 is a memory cell adjacent to the memory cell MC1 and has the control gate line CGL0, memory gate line MGL0 and source line SL0 in common with the memory cell MC1. A memory cell MC4 is a memory cell adjacent to the memory cell MC2 and has the control gate line CGL1, memory gate line MGL1 and source line SL0 in common with the memory cell MC2. The drain regions of the memory cell MC3 and memory cell MC4 are coupled to a data line DL1 which is different from the data line DL0.

Figure 3:
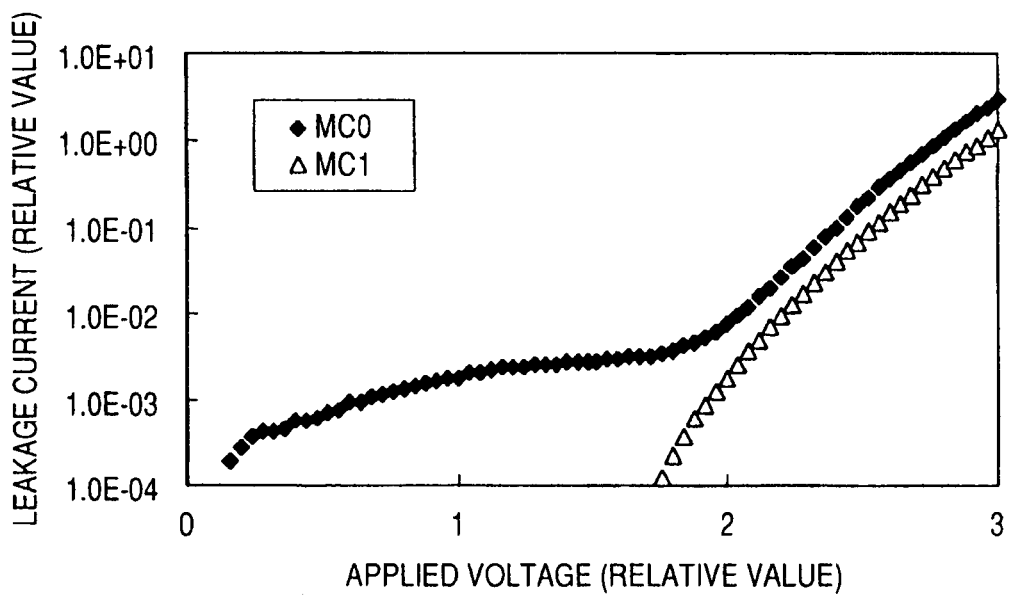
FIG. 3 is a characteristic diagram of the nonvolatile memory of FIG. 1.
Figure 23:
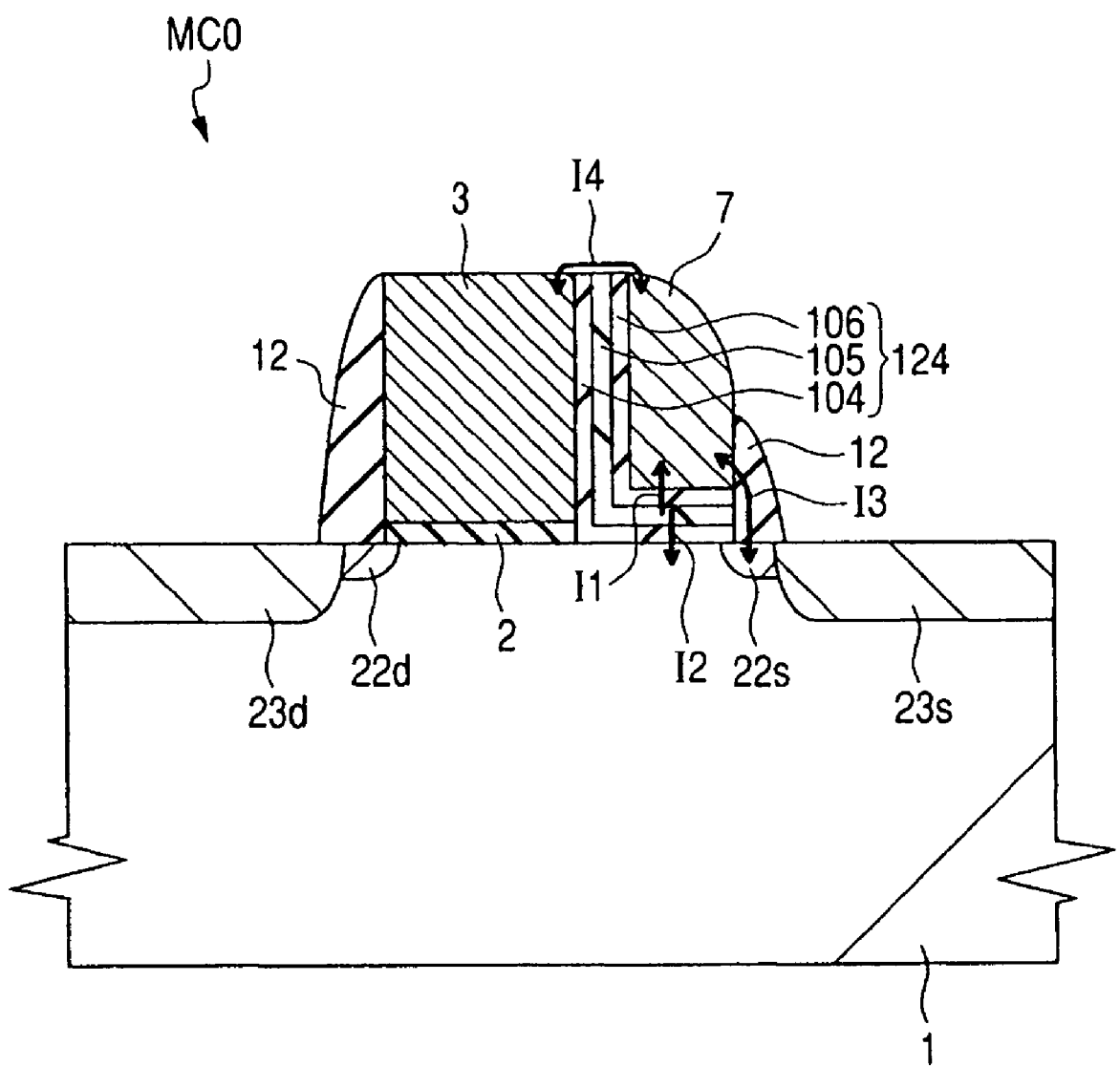
FIG. 23 is a fragmentary cross-sectional view schematically illustrating a semiconductor device investigated by the present inventors.

A leakage current (relative value) generated when a voltage is applied to the memory gate 7 of the nonvolatile memory according to Embodiment of the present invention will next be described referring to FIG. 3. FIG. 3 shows the memory cell (MC1) according to this Embodiment and a memory cell (MC0) investigated by the present inventors. Described specifically, FIG. 3 shows the characteristics of the memory cell MC1 as illustrated in FIG. 1 and having cavities 8a and 8c in the ONO film 24 below the memory gate 7 and the memory cell MC0 as illustrated in FIG. 23 and having no cavities in the ONO film 124 below the memory gate 7.

As is apparent from FIG. 3, reduction in a leakage current on the low voltage side is observed in the memory cell (MC1) compared with the memory cell (MC0). This is presumed to occur because the condition of the processed surface of the ONO film 124, on the side of the sidewall spacer 12, of the memory cell MC0 as illustrated in FIG. 23 is different from that of the ONO film 24, on the side of the sidewall spacer 12, of the memory cell MC1 as illustrated in FIG. 1. Described specifically, the processed surface of the ONO film 124 is linear from the end of the memory gate 7 to the substrate 1, while the processed surface of the ONO film 24 is uneven because of the presence of cavities 8a and 8c so that electric field at the other end of the memory gate 7 can be weakened when a low voltage is applied to the memory gate 7 and an electric current does not flow smoothly through the processed surface of the memory cell MC1. In other words, a region of the ONO film 24 which is formed between the memory gate 7 and substrate 1 and near the source region 23s is adjusted to be highly insulating. Employment of a structure as the memory cell MC1 of this Embodiment of the present invention enables reduction of the leakage current.

When a rewrite operation of a predetermined selected memory cell is repeated, a non-selected memory cell which is adjacent to the selected memory cell and has a word line in common therewith, a disturb phenomenon, that is, a rise in the threshold voltage which is not desired essentially, may sometimes occur. When such a phenomenon occurs, the threshold voltage of the non-selected memory cell MC3 gradually increases, leading to an increase in the voltage exceeding a predetermined level and programming error of the memory information. In this Embodiment, on the other hand, the nitride film 8 serving as a charge storage film has the cavities 8a and 8c thereabove and therebelow, respectively so that such a transfer of charges can be blocked.

In addition, regardless of whether or not the rewrite operation of a predetermined memory cell is performed, when it is left under high temperature conditions, a retention phenomenon, that is, a change in the threshold voltage of the memory cell may sometimes occur as a result of transfer of charges accumulated in the nitride film 5 serving as a charge storage film to the substrate 1 or the like. In this Embodiment, on the other hand, such a transfer of charges can be blocked because the nitride film 5 serving as a charge storage film has the cavities 8a and 8c thereabove and therebelow as described above.

For program and erase operations in this Embodiment, an ionizing collision phenomenon by hot electron injection and hot hole injection is employed so that a memory cell can be rewritten without being influenced by the cavities 8a and 8c. In short, the cavities 8a and 8c do not cause any inconvenience in each operation of the memory cell. Moreover, the structure which hardly generates the disturb phenomenon and retention phenomenon as described above can be employed so that the nonvolatile memory has improved data retention properties.

Similarly, although the processed surface of the ONO film 124 at the upper portions of the memory gate 7 and control gate 3 of the memory cell MC0 is linear, the processed surface of the ONO film 24 at the upper portions of the memory gate 7 and control gate 3 of the memory cell MC1 is uneven due to the cavities 8b and 8d. When a voltage is applied to the memory gate 7 and control gate 3 of the memory cell MC1, an electric field at the end portion of the memory gate 7 (upper portion of the memory gate 7) can therefore be weakened, which disturbs smooth current flow through the processed surface of the ONO film of the memory cell MC1. Accordingly, the structure as employed in the memory cell MC1 of the embodiment of the present invention enables reduction in the leakage current.

FIG. 3 shows reduction in the leakage current of the memory cell (MC1) on the high voltage side compared with that of the memory cell (MC0). This is presumed to occur because the condition of the contact surfaces of the bottom oxide film 104 and top oxide film 106 of the memory cell MC0 as illustrated in FIG. 23 with the nitride film 105 is different from the condition of the contact surfaces of the bottom oxide film 4 and top oxide film 6 of the memory cell MC1 as illustrated in FIG. 1 with the nitride film 5. Described specifically, the contact area of the bottom oxide film 4 and top oxide film 6 of the memory cell MC1 with the nitride film 5 is smaller than the contact area of the bottom oxide film 104 and top oxide film 106 of the memory cell MC0 with the nitride film 105 so that the electric current when a high voltage is applied to the memory gate 7 does not flow smoothly through the memory cell MC1. Accordingly, employment of a structure as that of the memory cell MC1 relating to the embodiment of the present invention enables reduction of a leakage current, whereby the nonvolatile memory has improved data retention properties.

Thus, in this Embodiment, the cavities 8a, 8b, 8c and 8d are formed adjacent to the ONO film 24. This means that the ONO film of the nonvolatile memory has cavities. The ONO film of the nonvolatile memory (refer to FIG. 23) investigated by the present inventors and those disclosed by Japanese Unexamined Patent Publication Nos. 2002-231829 and 2005-64178, on the other hand, has no cavities in their structures.

Each of program, erase and read operations when the memory cell MC1 relating to this Embodiment is used as a selected memory cell will next be explained. In this explanation, injection of electrons into the ONO film 24 is defined as "programming", while injection of holes is defined as "erasing".

For programming, hot electron programming system which is so-called source-side injection system can be employed. Upon programming, a predetermined Vdd (~1.5V), 12V, 6V, 1V and 0V are applied to the control gate 3, memory gate 7, source region 23s, drain region 23d and well 20, respectively. Hot electrons are generated in a region which is within a channel region formed between the source region 23s and drain region 23d and at the same time is near the midway between the control gate 3 and memory gate 7, and are injected into the ONO film 24. The electrons thus injected are caught in a trap in the nitride film 5, resulting in an increase in the threshold voltage of the memory transistor M1.

For erasing, a hot hole injection erase system utilizing a channel current is employed. Upon erasing, voltages of 0V, −6V, 6V, 0V and 0V are applied to the control gate 3, memory gate 7, source region 23s, drain region 23d and well 20, respectively, whereby a channel region is formed in the well 20 below the control gate 3. Since a high voltage (6V) is applied to the source region 23s, a depletion layer extending from the source region 23s approaches the channel region of the control transistor C1. As a result, electrons flowing through the channel region are accelerated into impact ions by the high electric field between the end portion of the channel region and the source region 23s, whereby a pair of an electron and a hole is formed. The hole is accelerated into a hot hole by a negative voltage (−6V) applied to the memory gate 7 and injected into the ONO film 24. The hole thus injected is caught in a trap in the nitride film 5, leading to a reduction in the threshold voltage of the memory transistor M1.

Upon reading, voltages of Vdd, Vdd, 0V, Vdd and 0V are applied to the control gate 3, memory gate 7, source region 23s, drain region 23d and well 20, respectively. By setting the voltage to be applied to the memory gate 7 to a value between the threshold voltage of the memory transistor M1 in a program state and the threshold voltage of the memory transistor M1 in an erase state, the program state can be discriminated from the erase state.

A manufacturing method of the nonvolatile memory according to Embodiment 1 of the present invention will next be described in the order of steps referring to FIG. 4 to FIG. 21.

Figure 4:
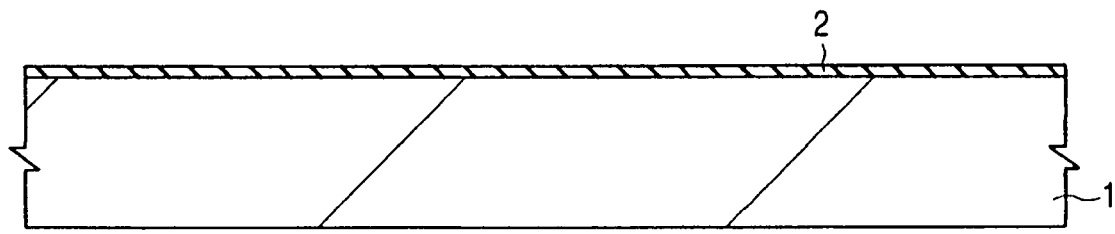
FIG. 4 is a fragmentary cross-sectional view schematically illustrating the semiconductor device of Embodiment 1 during a manufacturing step thereof.

As illustrated in FIG. 4, after formation of an n buried layer and p well (not illustrated) over the main surface (element formation surface) of the substrate 1 by using a well known manufacturing process, a gate insulating film 2 is formed. This gate insulating film 2 is made of, for example, a silicon oxide ($SiO_2$) film formed by thermal oxidation of the surface of the substrate 1 made of a silicon substrate. The thickness of the gate insulating film 6 varies, depending on the voltage to be applied and it is from about 1 to 5 nm. The gate insulating film 2 may be formed by CVD (Chemical Vapor Deposition).

Figure 5:
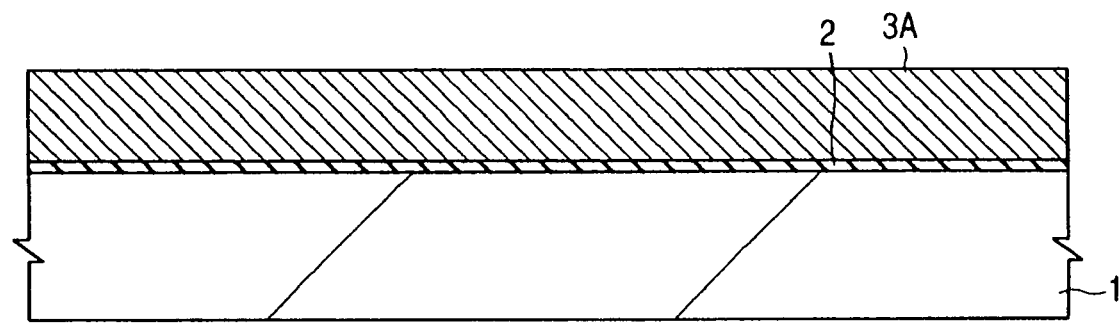
FIG. 5 is a fragmentary cross-sectional view schematically illustrating the semiconductor device during a manufacturing step thereof following that of FIG. 4.

As illustrated in FIG. 5, an electrode material film 3A is then formed over the gate insulating film 2 (substrate 1). The electrode material film 3A is made of, for example, a polysilicon film formed by CVD. The thickness of the electrode material film 3A varies, depending on the voltage to be applied or generation of the microfabrication technology and is from about 100 to 300 nm. The polysilicon film has an n conductivity type. The polysilicon film having an n conductivity type can be obtained by ion implantation of an impurity (phosphorus or arsenic) to an undoped polysilicon film.

Figure 6:
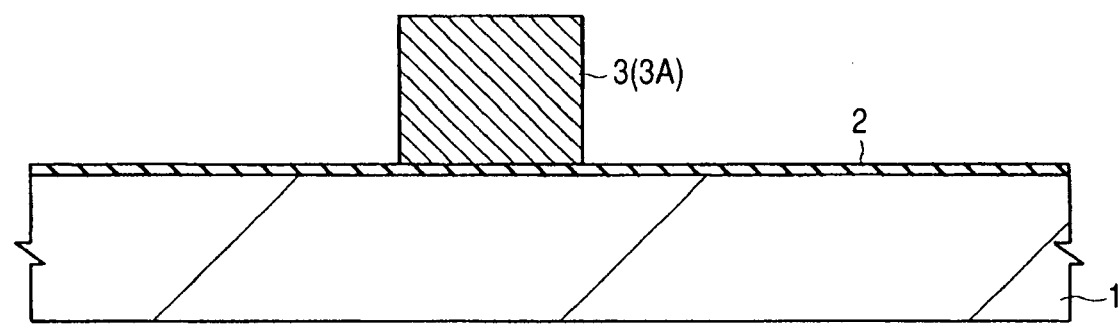
FIG. 6 is a fragmentary cross-sectional view schematically illustrating the semiconductor device during a manufacturing step thereof following that of FIG. 5.

As illustrated in FIG. 6, a control gate 3 is formed. The control gate 3 is formed by patterning the electrode material film 3A by photolithography and etching.

Figure 7:
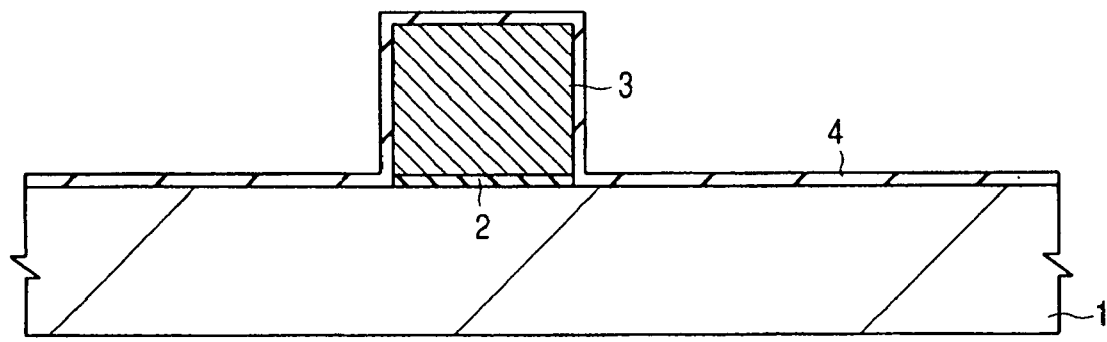
FIG. 7 is a fragmentary cross-sectional view schematically illustrating the semiconductor device during a manufacturing step thereof following that of FIG. 6.

As illustrated in FIG. 7, after removal of an unnecessary gate insulating film other than the gate insulating film 2 below the control gate 3 to expose the surface of the substrate 1, a bottom oxide film 4 is formed to cover therewith the surface of the control gate 3 and exposed surface of the substrate 1. The bottom oxide film 4 is made of, for example, a silicon oxide ($SiO_2$) film formed by the thermal oxidation of the surface of the control gate 3 made of a polysilicon film and the surface of the substrate 1 made of a silicon substrate. The thickness of the bottom silicon oxide film 4 differs, depending on the target properties and film forming conditions and is from about 1 to 10 nm. The bottom silicon oxide film 4 may be formed by CVD, alternatively.

Figure 8:
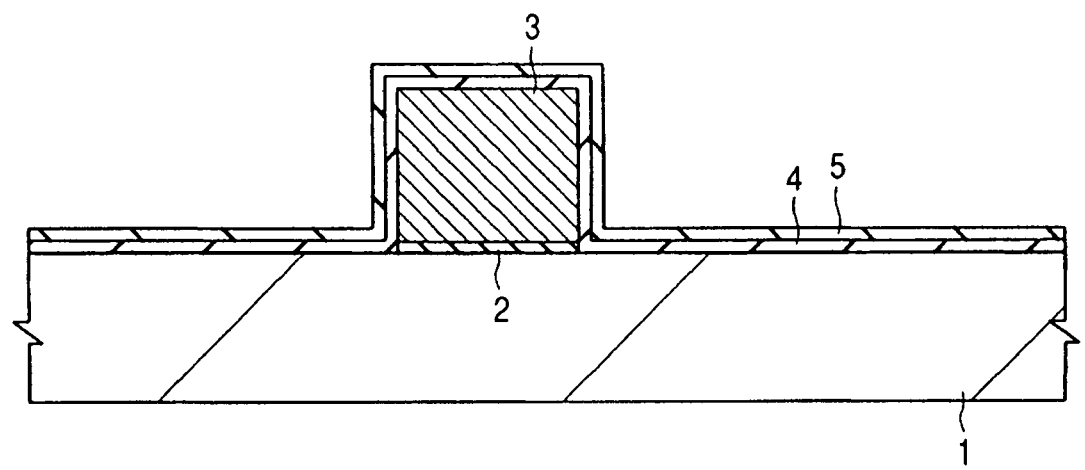
FIG. 8 is a fragmentary cross-sectional view schematically illustrating the semiconductor device during a manufacturing step thereof following that of FIG. 7.

As illustrated in FIG. 8, a nitride film 5 which will be a charge storage film is then formed over the bottom oxide film 4. This nitride film 5 is made of, for example, silicon nitride (SiN) formed by CVD. The thickness of the nitride film 5 differs, depending on the target properties and film forming conditions and is from about 5 to 20 nm. The nitride film 5 may be a film capable of accumulating charges therein and it may be, for example, a silicon oxynitride (SiON) film.

Figure 9:
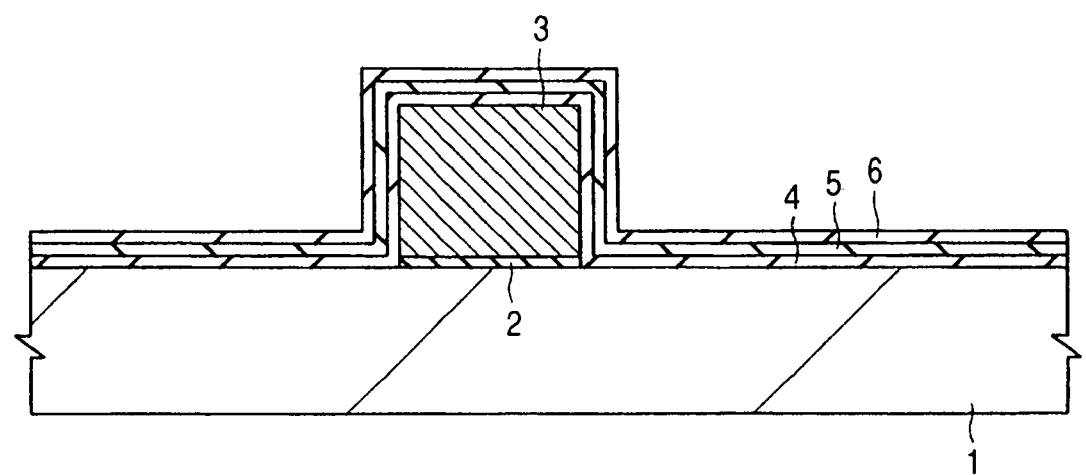
FIG. 9 is a fragmentary cross-sectional view schematically illustrating the semiconductor device during a manufacturing step thereof following that of FIG. 8.

As illustrated in FIG. 9, a top oxide film 6 is then formed over the nitride film 5. The top oxide film 6 is made of, for example, a silicon oxide ($SiO_2$) film formed by the thermal oxidation of the nitride film 5 made of a silicon nitride film. The thickness of the top oxide film 6 differs depending on the target properties and film forming conditions and is from about 5 to 15 nm. The top oxide film 6 may be formed by CVD, alternatively.

These bottom oxide film 4, nitride film 5 and top oxide film 6 constitute an ONO film. The thickness of the ONO film differs depending on the thicknesses of the bottom oxide film 4, nitride film 5 and top oxide film 6 but is adjusted to about 50 nm or less. In other words, the thickness of each of the bottom oxide film 4, nitride film 5 and top oxide film 6 is controlled to give the thickness of the ONO film not greater than about 50 nm.

Figure 10:
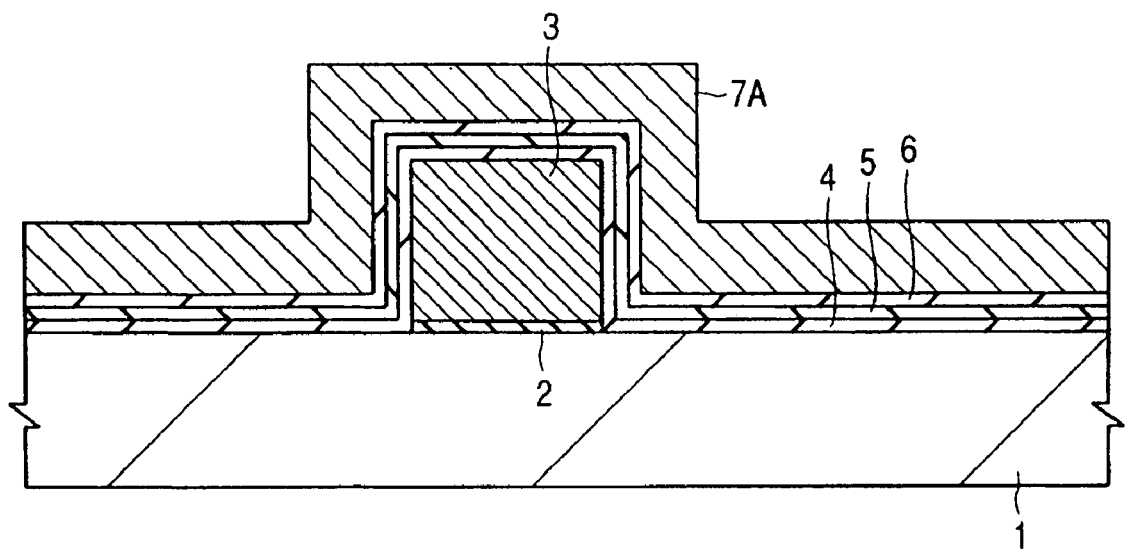
FIG. 10 is a fragmentary cross-sectional view schematically illustrating the semiconductor device during a manufacturing step thereof following that of FIG. 9.

As illustrated in FIG. 10, an electrode material film 7A is then formed over the top oxide film 6. This electrode material film 7A is made of a polysilicon film formed by CVD. The thickness of the electrode material film 7A differs depending on the target properties and is from about 20 to 150 nm. This polysilicon film has an n conductivity type. The polysilicon film having an n conductivity type can be obtained by ion implantation of an impurity (phosphorus or arsenic) into an undoped polysilicon film.

Figure 11:
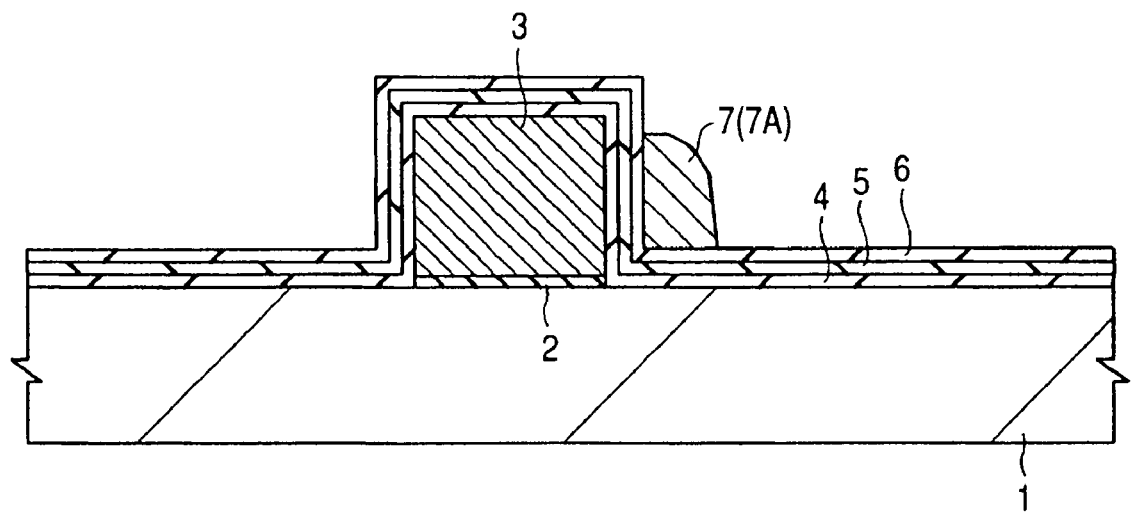
FIG. 11 is a fragmentary cross-sectional view schematically illustrating the semiconductor device during a manufacturing step thereof following that of FIG. 10.

As illustrated in FIG. 11, a memory gate 7 is then formed over the substrate (top oxide film 6) 1 along one of the sidewalls of the control gate 3. The memory gate 7 is formed by carrying out highly anisotropic etching of the electrode material film 7A to leave the electrode material film 7A on both sidewalls of the control gate 3, and then removing the electrode material film 7A from the other sidewall of the control gate 3 by photolithography and etching. A split gate of the control gate 3 and memory gate 7 via the ONO film is thus formed.

Figure 12:
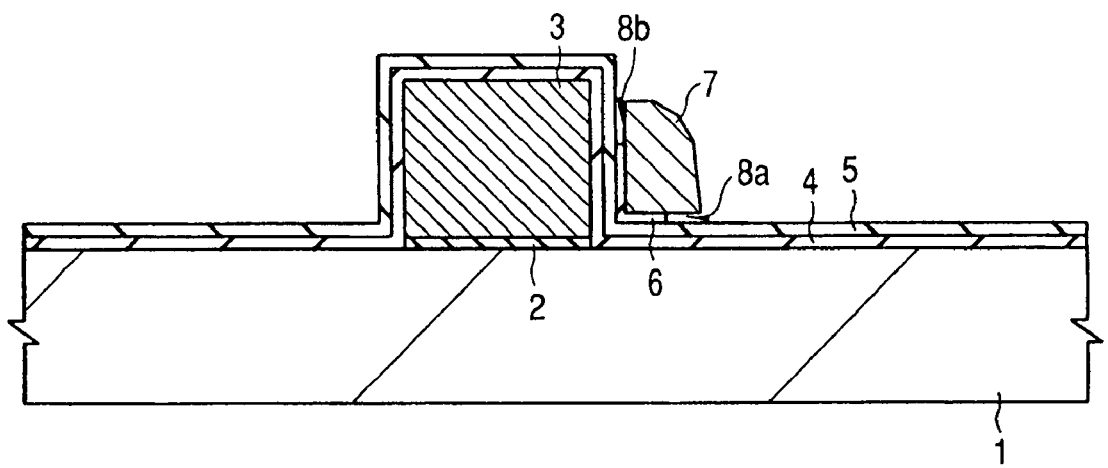
FIG. 12 is a fragmentary cross-sectional view schematically illustrating the semiconductor device during a manufacturing step thereof following that of FIG. 11.

As illustrated in FIG. 12, an unnecessary portion of the top oxide film 6 is then removed. The unnecessary portion of the top oxide film 6 is removed, for example, by wet etching with HF. This wet etching is performed until the length of the top oxide film 6 which is below the memory gate 7 and extends in a gate length direction of the memory gate 7 becomes about one third of the gate length of the memory gate 7.

By this wet etching, a portion of the top oxide film 6 along the memory gate 7 remains. In other words, a cavity 8a is placed adjacent to the top oxide film 6 in a position which is between the nitride film 5 and memory gate 7 and at the same time, is below the end of the memory gate 7. A cavity 8b is placed adjacent to the top oxide film 6 in a position which is between the nitride film 5 and memory gate 7 and over the upper side surface of the memory gate 7.

Figure 13:
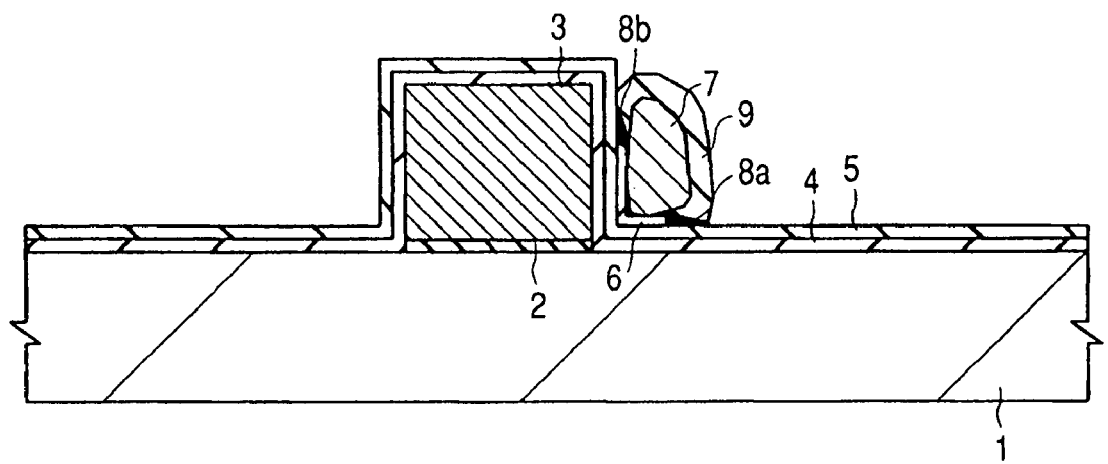
FIG. 13 is a fragmentary cross-sectional view schematically illustrating the semiconductor device during a manufacturing step thereof following that of FIG. 12.

As illustrated in FIG. 13, an oxide film 9 is then formed on the surface of the memory gate 7. This oxide film 9 is made of a silicon oxide ($SiO_2$) film formed by the thermal oxidation of the surface of the memory gate 7 made of a polysilicon film. In short, the memory gate 7 is subjected to Selocs (Selective Oxide Coating of Silicon Gate). The oxide film 9 is adjusted to be thick enough to close the cavities 8a and 8b therewith in consideration of the Selocs ratio of the polysilicon film which will be the memory gate 7. In the diagrams of the present application including FIG. 13, cavities such as cavities 8a and 8b are marked out to facilitate understanding that the cavities are closed.

Figure 14:
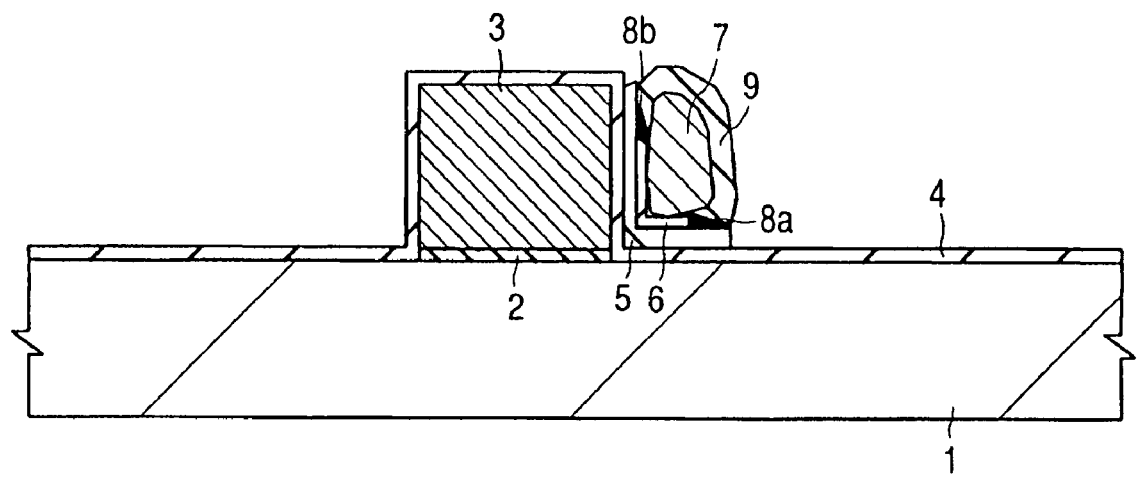
FIG. 14 is a fragmentary cross-sectional view schematically illustrating the semiconductor device during a manufacturing step thereof following that of FIG. 13.

As illustrated in FIG. 14, an unnecessary portion of the nitride film 5 is then removed. The unnecessary portion of the nitride film 5 is removed by etching with a sufficient etch selectivity relative to the bottom oxide film 4. For example, wet etching is performed with hot phosphoric acid or the like. In this wet etching, the memory gate 7 serves as a mask to leave the nitride film 5 between the memory gate 7 and substrate 1 and the nitride film 5 between the memory gate 7 and control gate 3.

Figure 15:
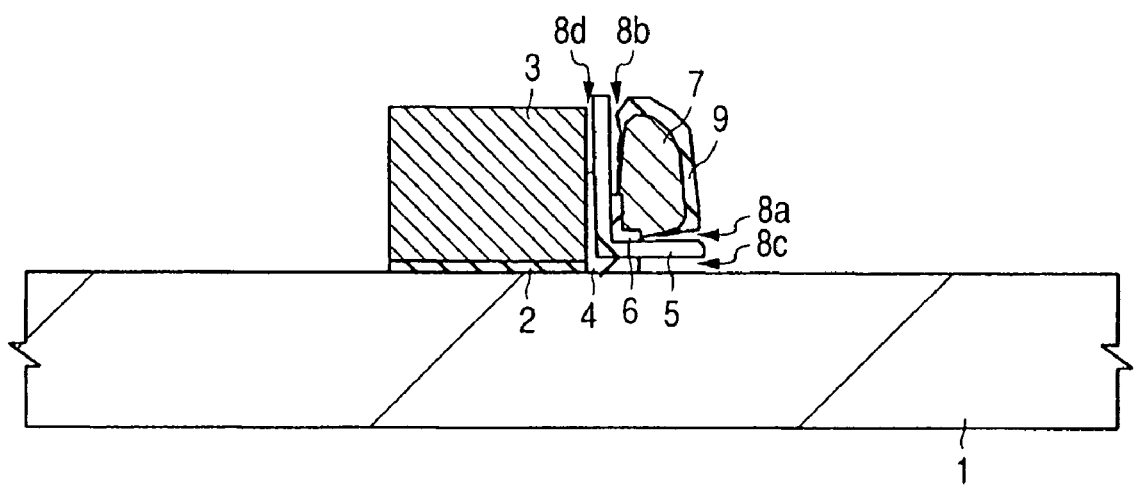
FIG. 15 is a fragmentary cross-sectional view schematically illustrating the semiconductor device during a manufacturing step thereof following that of FIG. 14.

As illustrated in FIG. 15, an unnecessary portion of the bottom oxide film 4 is then removed. For example, the unnecessary portion of the bottom oxide film 4 is removed by wet etching with HF to expose the surface of the substrate 1. This wet etching is performed until the bottom oxide film 4 which is below the memory gate 7 and extends in the gate length direction of the memory gate 7 becomes about one third of the gate length of the memory gate 7. During wet etching, the oxide film 9 is also etched to have a decreased film thickness. In this case, the cavities 8a and 8b are sometimes not closed by the oxide film 9.

This wet etching leaves a portion of the bottom oxide film 4 along the memory gate 7. In other words, a cavity 8c which lies between the nitride film 5 and substrate 1 and below the end portion of the memory gate 7 is placed adjacent to the bottom oxide film 4. In addition, a cavity 8d which lies between the nitride film 5 and control gate 3 and over the upper side surface of the control gate 3 is disposed adjacent to the bottom oxide film 4.

In this Embodiment, after formation of the cavity 8a (refer to FIG. 12), the cavity 8c is formed by another step (refer to FIG. 15). It is also possible to form no cavity 8a in the step of FIG. 12 and form the cavity 8a simultaneously with the cavity 8c in the step of FIG. 15. Formation of the cavities 8a and 8c in one step makes it possible to form the cavities 8a and 8c with a substantially same length in the gate length direction of the memory gate 7. When the cavities 8a and 8c are formed in respective steps, the length of the cavities 8a and 8c in the gate length direction of the memory gate 7 can be controlled. For example, by making the length of the cavity 8a in the gate length direction of the memory gate 7 longer than that of the cavity 8c, it is possible to prevent the transfer of the charges accumulated in the nitride film 5 serving as a charge storage film into the memory gate 7, accumulate charges from the substrate 1 to the nitride film 5 and prevent the transfer of charges accumulated therein to the substrate 1. Thus, the nonvolatile memory having the ONO film 24 has improved data retention properties.

In this Embodiment, the cavity 8c is formed as illustrated in FIG. 15, but the cavity 8c need not be formed. It is possible to prevent the transfer of charges, which has been accumulated in the nitride film 5 serving as a charge storage film, to the memory gate 7 even by disposing only the cavity 8a adjacent to the top oxide film 6 constituting the ONO film 24. The nonvolatile memory having the ONO film 24 can therefore have improved data retention properties.

Figure 16:
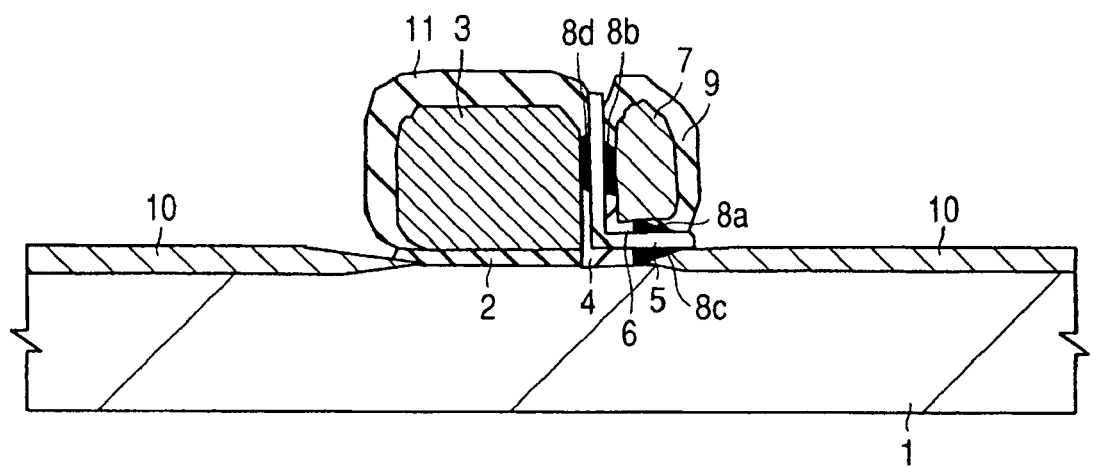
FIG. 16 is a fragmentary cross-sectional view schematically illustrating the semiconductor device during a manufacturing step thereof following that of FIG. 15.

After formation of a lightly-doped semiconductor region (not illustrated) by ion implantation of an impurity into the substrate 1 by photolithography and ion implantation technology, an oxide film 10 is formed on the surface of the exposed substrate 1, and an oxide film 11 is formed on the control gate 3 as illustrated in FIG. 16, and at the same time, the oxide film 9 on the surface of the memory gate 7 is thickened. The oxide film 10 is made of a silicon oxide ($SiO_2$) film formed by the thermal oxidation of the surface of the substrate 1 made of a silicon substrate. The oxide film 11 is made of a silicon oxide ($SiO_2$) film formed by the thermal oxidation of the surface of the control gate 3 made of a polysilicon film. In short, the control gate 3 is subjected to Selocs. The oxide film 9 is adjusted to be thick enough to close the cavities 8a and 8b therewith in consideration of the Selocs ratio of the polysilicon film which will be the control gate 7. The oxide film 10 is adjusted to be thick enough to close the cavity 8c therewith. The oxide film 11 is adjusted to be thick enough to close the cavity 8d therewith in consideration of the Selocs ratio of the polysilicon film which will be the control gate 3.

Figure 17:
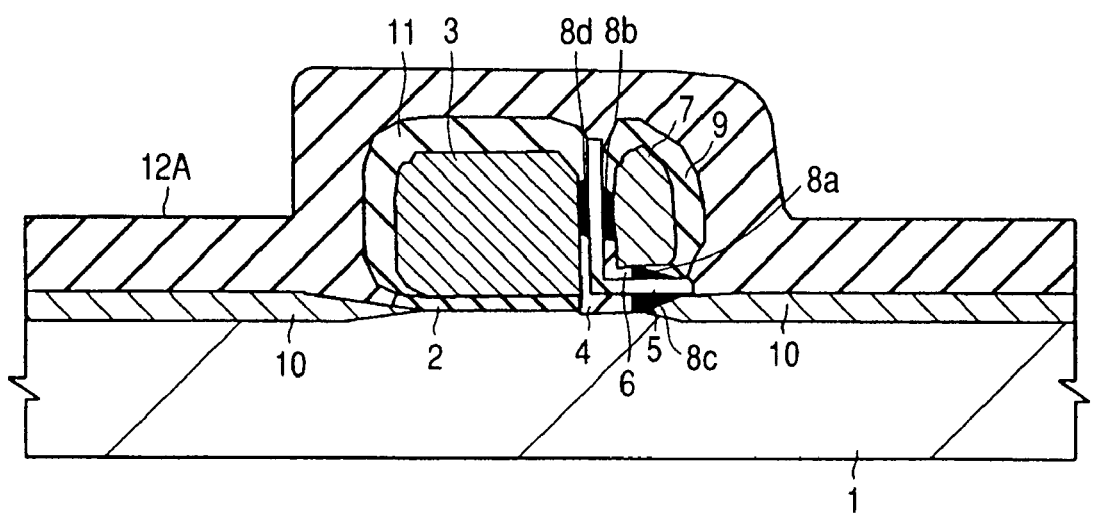
FIG. 17 is a fragmentary cross-sectional view schematically illustrating the semiconductor device during a manufacturing step thereof following that of FIG. 16.

As illustrated in FIG. 17, an insulating film 12A is formed over the substrate 1 to cover therewith a split gate composed of the control gate 3 and memory gate 7. This insulating film 12A is made of a silicon oxide ($SiO_2$) film formed by, for example, CVD. The thickness of the insulating film 12A differs depending on the target properties and is from about 50 to 200 nm.

Figure 18:
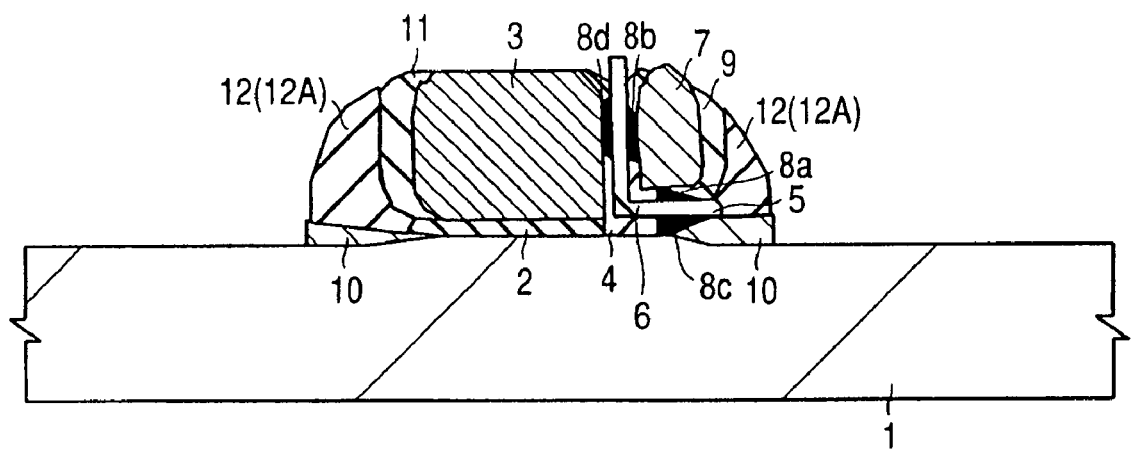
FIG. 18 is a fragmentary cross-sectional view schematically illustrating the semiconductor device during a manufacturing step thereof following that of FIG. 17.

As illustrated in FIG. 18, sidewall spacers 12 are then formed over the substrate 1 along the side walls of the split gate composed of the control gate 3 and memory gate 9. These sidewall spacers 12 are formed by subjecting the insulating film 12A to highly anisotropic etching to leave the insulating film 12A on both sides of the split gate. By this etching, the oxide film 11 on the surface of the control gate 3 and the oxide film 9 on the surface of the memory gate 7 are removed.

Figure 19:
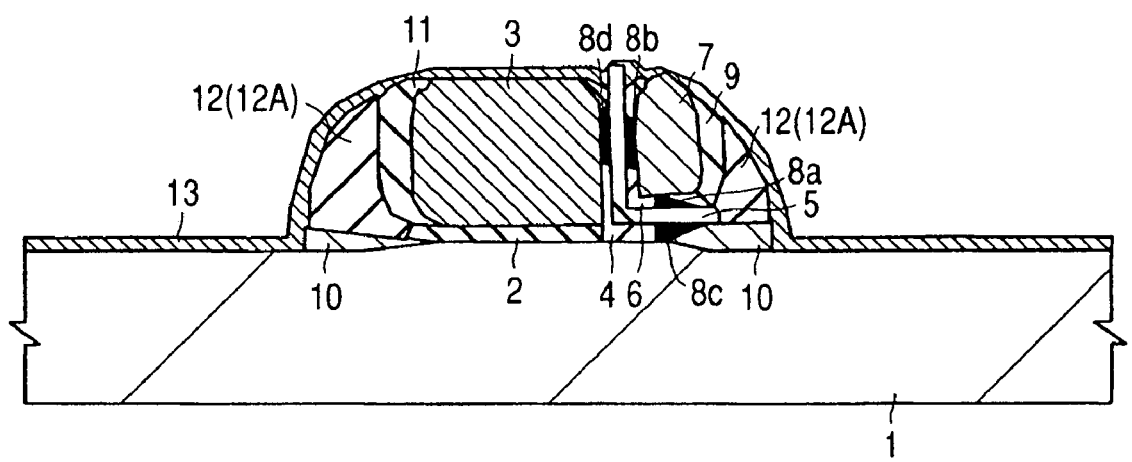
FIG. 19 is a fragmentary cross-sectional view schematically illustrating the semiconductor device during a manufacturing step thereof following that of FIG. 18.

By photolithography and ion implantation technology, an impurity is then ion-implanted into the substrate 1 to form a heavily-doped semiconductor region (not illustrated). Then, as illustrated in FIG. 19, a metal film 13 is formed over the substrate 1 to cover therewith the split gate composed of the control gate 3 and memory gate 7. This metal film 13 is made of, for example, a cobalt (Co) film formed by vapor deposition. The thickness of the metal film 13 differs depending on the target properties and is from about 5 to 20 nm.

Figure 20:
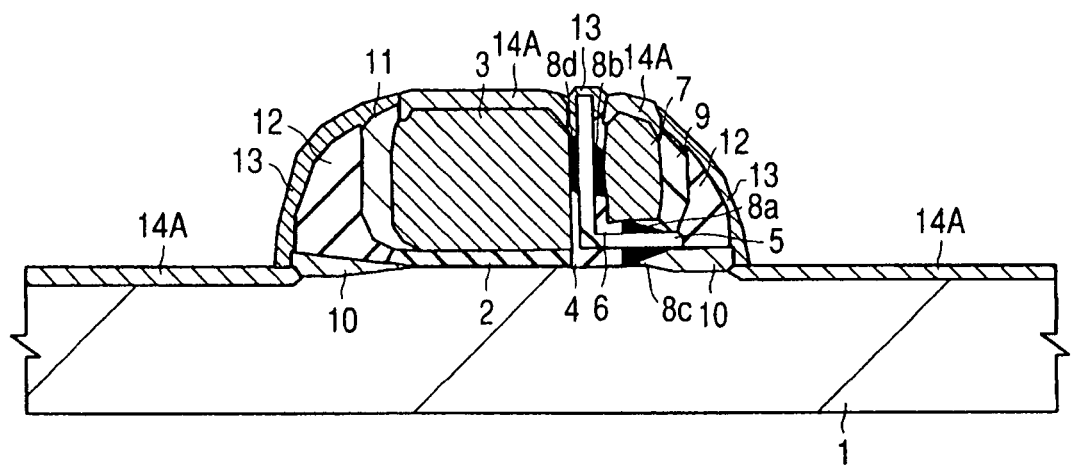
FIG. 20 is a fragmentary cross-sectional view schematically illustrating the semiconductor device during a manufacturing step thereof following that of FIG. 19.

As illustrated in FIG. 20, a silicide film 14A is formed on the surfaces of the control gate 3, memory gate 7 and substrate 1. This silicide film 14A is made of a cobalt silicide (CoSi) film obtained by reacting the control gate 3, memory gate 7 and substrate 1 (made of a polysilicon film or silicon substrate) with the metal film 13 (made of a cobalt film) by means of heat treatment (first heat treatment). The conditions of the first heat treatment differ depending on the target properties and they are, for example, a substrate temperature of from about 350 to 500° C. and heating time of about 45 seconds.

Figure 21:
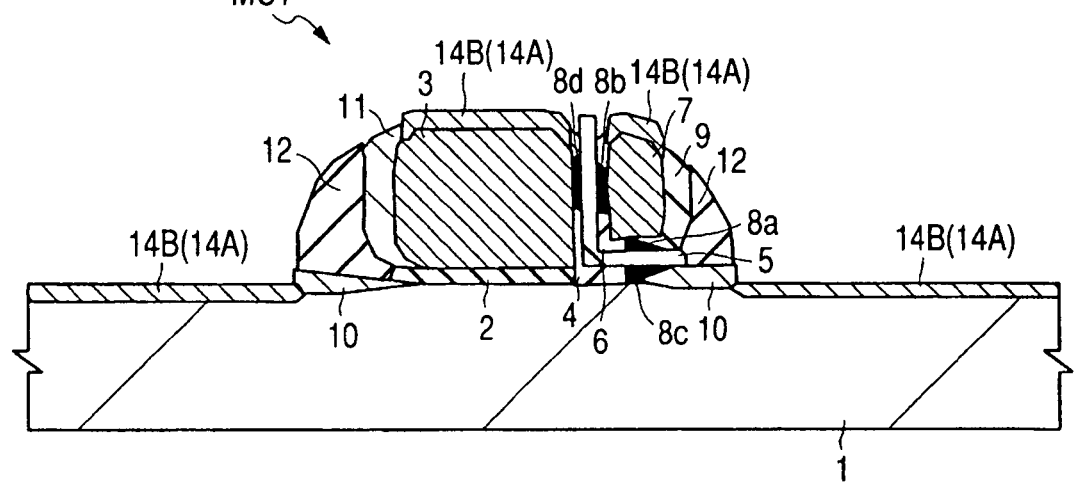
FIG. 21 is a fragmentary cross-sectional view schematically illustrating the semiconductor device during a manufacturing step thereof following that of FIG. 20.

As illustrated in FIG. 21, after removal of an unreacted portion of the metal film 13, a silicide film 14B is formed on the surfaces of the control gate 3, memory gate 7 and substrate 1. This silicide film 14B is made of a cobalt silicide ($CoSi_2$) film obtained by phase transformation of the silicide film 14A by means of heat treatment (second heat treatment). The conditions of the second heat treatment differ depending on the target properties and they are, for example, a substrate temperature of from about 650 to 800° C. and heating time of about 60 seconds.

As illustrated in FIG. 1, a protective film 15 made of a silicon nitride film and an interlayer insulating film 16 made of a silicon oxide film are then formed by CVD all on the surface of the substrate 1 including the control gate 3 and memory gate 7, followed by planarization of the surface by CMP. A connecting hole 17 is formed in the protective film 15 and interlayer insulating film 16 by etching. After formation of a contact plug 18 by filling a conductor such as metal inside of this connecting hole 17, an interconnect 19 is formed over the interlayer insulating film 16.

The memory cells (MC1 and MC2) each has, as described above, the control gate 3 formed over the substrate 1 via the gate insulating film 2, the ONO film 24 having one part formed over one of the sidewalls of the control gate 3 and the other part formed over the substrate 1, and the memory gate 7 electrically isolated from the control gate 3 via the one part of the ONO film 24 and at the same time, electrically isolated from the substrate 1 via the other part of the ONO film 24. The ONO film 24 has the top oxide film 6, nitride film 5 and bottom oxide film 4 arranged in the order of mention from the side of the memory gate 7.

In the memory cells (MC1 and MC2), the cavity 8a is disposed, in a position between the nitride film 5 and memory gate 7 and at the same time, below the end portion of the memory gate 7, adjacent to the top oxide film 6 of the other part of the ONO film 24, while the cavity 8c is disposed, in a position between the nitride film 5 and substrate 1 and at the same time below the end portion of the memory gate 7, adjacent to the bottom oxide film 4 of the other part of the ONO film 24. In addition, the cavity 8b is disposed, in a position between the nitride film 5 and memory gate 7 and at the same time, over the upper side surface of the memory gate 7, adjacent to the top oxide film 6 of the one part of the ONO film 24, while the cavity 8d is disposed, in a position between the nitride film 5 and control gate 3 and at the same time over the upper side surface of the control gate 3, adjacent to the bottom oxide film 4 of the one part of the ONO film 24.

Each of the memory cells (MC1 and MC2) further has the oxide film 9 formed by the oxidation of the surface of the memory gate 7 and extending to the nitride film 5 and the oxide film 10 formed by the oxidation of the surface of the substrate 1 and extending to the nitride film 5. The cavity 8a is closed with the oxide film 9, while the cavity 8c is closed with the oxide film 10. Each of them has further the oxide film 11 formed by the oxidation of the surface of the control gate 3 and extending to the nitride film 5. The cavity 8b is closed with the oxide film 9, while the cavity 8d is closed with the oxide film 11.

Each of the memory gates (MC1 and MC2) further has sidewall spacers 12 made of an insulating film formed over the main surface of the substrate 1 along the side walls of the memory gate 7. The cavity 8a is closed with the sidewall spacer 12 via the oxide film 9, while the cavity 8c is closed with the sidewall spacer 12 via the oxide film 10.

With the memory cells (MC1 and MC2) having such structures, the nonvolatile memory having an ONO film has improved data retention properties as described above. (Embodiment 2) In Embodiment 1, as a nonvolatile memory which has an ONO film composed of a bottom oxide film, a nitride film and a top oxide film, a nonvolatile memory employing, as the positional relationship between the memory gate and control gate, a split gate memory cell structure was described. In Embodiment 2, on the other hand, a nonvolatile memory employing not a split gate structure but a structure having a memory gate on the ONO film will be described. Overlapping description between these Embodiments will be omitted.

Figure 22:
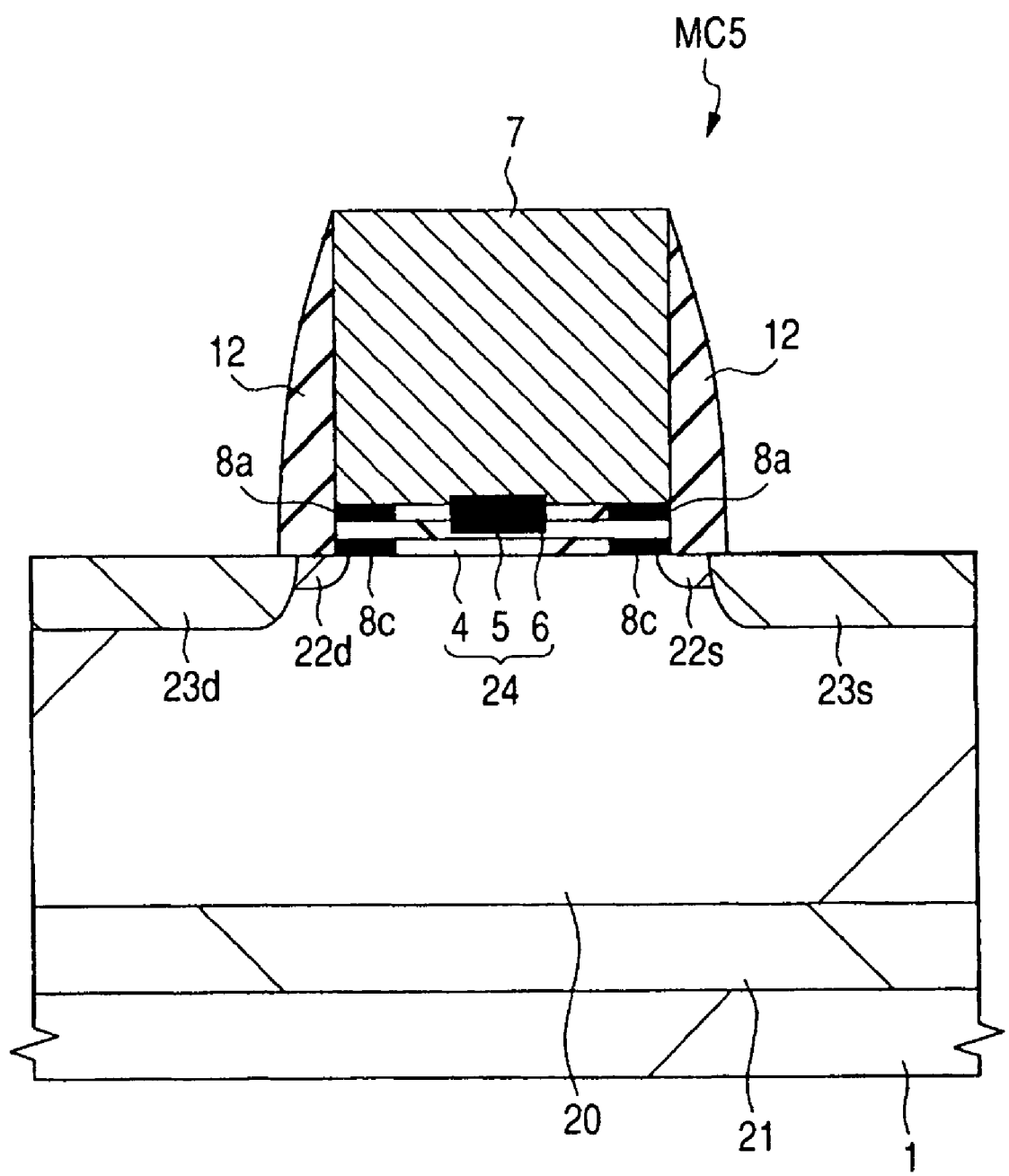
FIG. 22 is a fragmentary cross-sectional view schematically illustrating a semiconductor device according to Embodiment 2 of the present invention.

FIG. 22 is a fragmentary cross-sectional view illustrating a nonvolatile memory of Embodiment 2. A portion of the nonvolatile memory is omitted to facilitate the understanding.

In a memory cell MC5 of the nonvolatile memory, an ONO film 24 has a top oxide film 6, a nitride film 5 and a bottom oxide film 4 disposed in the order of mention from the side of the memory gate 7. During programming of data, hot electrons generated in a channel region are injected into the ONO film 24 and caught in a trap in the nitride film 5. A cavity 8a is disposed, in a position between the nitride film 5 and memory gate 7 and at the same time below the end portion of the memory gate 7, adjacent to the top oxide film 6 of the other part of the ONO film 24. A cavity 8c is disposed, in a position between the nitride film 5 and substrate 1 and at the same time below the end portion of the memory gate 7, adjacent to the bottom oxide film 4 of the other part of the ONO film 24. In FIG. 22, the cavities 8a and 8c are shown while being blacked out.

As explained above in Embodiment 1, the processed surface of the ONO film 24 is uneven owing to the presence of cavities 8a and 8c so that the flow of an electric current through the processed surface when a voltage is applied to the memory gate 7 is presumed not smooth in the memory cell MC5. In addition, a contact area between the nitride film 5 and the bottom oxide film 4 or between the nitride film 5 and the top oxide film 6 becomes smaller than that of the memory cell without cavities 8a and 8c, which is presumed to be a cause for the disturbance of the flow of an electric current in the memory cell MC5 when a voltage is applied to the memory gate 7. Accordingly, employment of a structure as that of the memory cell MC1 according to this Embodiment of the present invention enables reduction in a leakage current, leading to the improvement in the data retention properties of the nonvolatile memory.

The present invention made by the present inventors was described specifically based on some Embodiments. It should however be borne in mind that the present invention is not limited to or by these Embodiments. It is needless to say that these embodiments can be modified variously without departing from the scope of present invention.

For example, in the above-described Embodiments, cavities are formed by removing a portion of the bottom oxide film and top oxide film of the ONO film made of three layers, that is, bottom oxide film, nitride film serving as a charge storage film, and top oxide film, but the present invention can also be applied to the case where cavities are formed near a material film, for example, above and below the material film such as a charge storage film whose insulation is desired or whose contact with another portion is not desired.

The present invention is widely used by manufacturers of semiconductor devices.

What is claimed is:

1. A semiconductor device including a memory cell, which comprises:
    a bottom oxide film formed over the main surface of a semiconductor substrate;
    a nitride film formed over the bottom oxide film;
    a top oxide film formed over the nitride film; and
    a memory gate formed over the top oxide film, and accumulates charges from the semiconductor substrate in the nitride film by applying a voltage to the memory gate,
    wherein a cavity is disposed, in a position which is between the nitride film and the memory gate and is below an end portion of the memory gate, adjacent to the top oxide film, and
    wherein an oxide film formed by the oxidation of the surface of the memory gate extends to the nitride film to close the cavity.

2. A semiconductor device including a memory cell, which comprises:
    a bottom oxide film formed over the main surface of a semiconductor substrate;
    a nitride film formed over the bottom oxide film;
    a top oxide film formed over the nitride film; and a memory gate formed over the top oxide film, and accumulates charges from the semiconductor substrate in the nitride film by applying a voltage to the memory gate,
    wherein a first cavity is disposed, in a position between the nitride film and the memory gate and below an end portion of the memory gate, adjacent to the top oxide film, and
    wherein a second cavity is disposed, in a position between the nitride film and the semiconductor substrate and below an end portion of the memory gate, adjacent to the bottom oxide film.

3. A semiconductor device according to claim 2, further comprising an insulating film formed, along the sidewall of the memory gate, over the main surface of the semiconductor substrate to close the first cavity with the insulating film.

4. A semiconductor device according to claim 2, further comprising:
    a first oxide film formed by the oxidation of the surface of the memory gate to extend to the nitride film; and a second oxide film formed by the oxidation of the surface of the semiconductor substrate to extend to the nitride film, wherein the first cavity is closed with the first oxide film and the second cavity is closed with the second oxide film.

5. A semiconductor device including a memory cell, which comprises:

a control gate formed over the main surface of a semiconductor substrate via a gate insulating film;

an ONO film having a first part formed over one of the sidewalls of the control gate and a second part formed over the main surface of the semiconductor substrate; and a memory gate electrically isolated from the control gate via the first part of the ONO film and at the same time electrically isolated from the semiconductor substrate via the second part of the ONO film, wherein the ONO film is formed by disposing a top oxide film, a nitride film and a bottom oxide film in the order of mention from the side of the memory gate, wherein a first cavity is disposed, in a position between the nitride film and the memory gate and below an end portion of the memory gate, adjacent to the top oxide film of the second part of the ONO film, and wherein a second cavity is disposed, in a position between the nitride film and the semiconductor substrate and below an end portion of the memory gate, adjacent to the bottom oxide film of the second part of the ONO film.

6. A semiconductor device according to claim 5, further comprising an insulating film formed, over the main surface of the semiconductor substrate, along a sidewall of the memory gate, wherein the first cavity is closed with the insulating film.

7. A semiconductor device according to claim 5, further comprising:

a first oxide film formed by the oxidation of the surface of the memory gate to extend to the nitride film; and a second oxide film formed by the oxidation of the surface of the semiconductor substrate to extend to the nitride film, wherein the first cavity is closed with the first oxide film, and wherein the second cavity is closed with the second oxide film.

8. A semiconductor device according to claim 5, wherein a third cavity is disposed, in a position between the nitride film and the memory gate and over the upper side surface of the memory gate, adjacent to the top oxide film of the first part of the ONO film, and wherein a fourth cavity is disposed, in a position between the nitride film and the control gate and over the upper side surface of the control gate, adjacent to the bottom oxide film of the first part of the ONO film.

9. A semiconductor device according to claim 8, further comprising a third oxide film formed by the oxidation of the surface of the control gate to extend to the nitride film, wherein the third cavity is closed with the first oxide film, and wherein the fourth cavity is closed with the third oxide film.

10. A semiconductor device including a memory cell, which comprises:

a bottom oxide film formed over the main surface of a semiconductor substrate;

a nitride film formed over the bottom oxide film;

a top oxide film formed over the nitride film;

a memory gate formed over the top oxide film; and an insulating film formed, along the sidewall of the memory gate, and formed over the main surface of the semiconductor, and accumulates charges from the semiconductor substrate in the nitride film by applying a voltage to the memory gate, wherein a cavity is disposed in a position which is between the nitride film and the memory gate and between the top oxide film and the insulating film and is below an end portion of the memory gate.

11. A semiconductor device according to claim 10, further comprising an oxide film formed by the oxidation of the surface of the memory gate and extending to the nitride film, wherein the oxide film is disposed between the cavity and the insulating film.

12. A semiconductor device including a memory cell, which comprises:

a bottom oxide film formed over the main surface of a semiconductor substrate;

a nitride film formed over the bottom oxide film;

a top oxide film formed over the nitride film;

a memory gate formed over the top oxide film; and an insulating film formed along the sidewall of the memory gate and formed over the main surface of the semiconductor, and accumulates charges from the semiconductor substrate in the nitride film by applying a voltage to the memory gate, wherein a first cavity is disposed in a position between the nitride film and the memory gate and between the top oxide film and the insulating film and below an end portion of the memory gate, and wherein a second cavity is disposed in a position between the nitride film and the semiconductor substrate and between the bottom oxide film and the insulating film and below an end portion of the memory gate.

13. A semiconductor device according to claim 12, further comprising:

a first oxide film formed by the oxidation of the surface of the memory gate to extend to the nitride film; and a second oxide film formed by the oxidation of the surface of the semiconductor substrate to extend to the nitride film, wherein the first oxide film is disposed between the first cavity and the insulating film, and wherein the second oxide film is disposed between the second cavity and the insulating film.

14. A semiconductor device including a memory cell, which comprises:

a control gate formed over the main surface of a semiconductor substrate via a gate insulating film;

an ONO film having a first part formed over one of the sidewalls of the control gate and a second part formed over the main surface of the semiconductor substrate;

a memory gate electrically isolated from the control gate via the first part of the ONO film and electrically isolated from the semiconductor substrate via the second part of the ONO film; and an insulating film formed, along the sidewall of the memory gate, over the main surface of the semiconductor, wherein the ONO film is formed by disposing a top oxide film, a nitride film and a bottom oxide film in the order of mention from the side of the memory gate, wherein a first cavity is disposed in a position between the nitride film and the memory gate and between the top oxide film of the second part of the ONO film and the insulating film and below an end portion of the memory gate, and wherein a second cavity is disposed in a position between the nitride film and the semiconductor substrate and between the bottom oxide film of the second part of the ONO film and the insulating film and below an end portion of the memory gate.

15. A semiconductor device according to claim 14, further comprising:
   a first oxide film formed by the oxidation of the surface of the memory gate to extend to the nitride film; and
   a second oxide film formed by the oxidation of the surface of the semiconductor substrate to extend to the nitride film,
   wherein the first oxide film is disposed between the first cavity and the insulating film, and
   wherein the second oxide film is disposed between the second cavity and the insulating film.

16. A semiconductor device according to claim 15, further comprising a protective film made of a silicon nitride film formed over the main surface of the semiconductor substrate and over the control gate and the memory gate,
   wherein a third cavity is disposed, in a position between the nitride film and the memory gate and between the top oxide film of the first part of the ONO film and the protective film and over the upper side surface of the memory gate, adjacent to the top oxide film of the first part of the ONO film, and
   wherein a fourth cavity is disposed, in a position between the nitride film and the control gate and between the bottom oxide film of the first part of the ONO film and the protective film and over the upper side surface of the control gate, adjacent to the bottom oxide film of the first part of the ONO film.

17. A semiconductor device according to claim 16, further comprising:
   a first oxide film formed by the oxidation of the surface of the memory gate to extend to the nitride film;
   a second oxide film formed by the oxidation of the surface of the semiconductor substrate to extend to the nitride film; and
   a third oxide film formed by the oxidation of the surface of the control gate to extend to the nitride film,
   wherein the first oxide film is disposed between the first cavity and the insulating film,
   wherein the second oxide film is disposed between the second cavity and the insulating film
   wherein the first oxide film is disposed between the third cavity and the protective film, and
   wherein the third oxide film is disposed between the fourth cavity and the protective film.

18. A semiconductor device including a memory cell, which comprises:
   a control gate formed over the main surface of a semiconductor substrate via a gate insulating film;
   an ONO film having a first part formed over a sidewall of the control gate and a second part formed over the main surface of the semiconductor substrate;
   a memory gate electrically isolated from the control gate via the first part of the ONO film and electrically isolated from the semiconductor substrate via the second part of the ONO film; and
   an insulating film formed, along a sidewall of the memory gate, over the main surface of the semiconductor substrate,
   wherein the ONO film is formed by disposing a top oxide film, a nitride film and a bottom oxide film in the order of mention from the side of the memory gate, and
   wherein a first cavity is disposed in a position between the nitride film and the memory gate and between the top oxide film of the second part of the ONO film and the insulating film and below an end portion of the memory gate.

19. A semiconductor device according to claim 18, further comprising a first oxide film formed by the oxidation of the surface of the memory gate to extend to the nitride film,
   wherein the first oxide film is disposed between the first cavity and the insulating film.

20. A semiconductor device according to claim 18, further comprising:
   a protective film made of a silicon nitride film formed over the main surface of the semiconductor substrate and over the control gate and the memory gate,
   wherein a second cavity is disposed in a position between the nitride film and the memory gate and between the top oxide film of the first part of the ONO film and the protective film and over the upper side surface of the memory gate, and
   wherein a third cavity is disposed in a position between the nitride film and the control gate and between the bottom oxide film of the first part of the ONO film and the protective film and over the upper side surface of the control gate.

21. A semiconductor device according to claim 20, further comprising:
   a first oxide film formed by the oxidation of the surface of the memory gate to extend to the nitride film;
   a second oxide film formed by the oxidation of the surface of the control gate to extend to the nitride film,
   wherein the first oxide film is disposed between the first cavity and the insulating film,
   wherein the first oxide film is disposed between the second cavity and the protective film, and
   wherein the second oxide film is disposed between the third cavity and the protective film.

22. A semiconductor device according to claim 10, wherein hot electrons are injected into the nitride film for programming operation of the memory cell.

23. A semiconductor device according to claim 10, wherein hot holes are injected into the nitride film for erasing operation of the memory cell.

24. A semiconductor device according to claim 12, wherein hot electrons are injected into the nitride film for programming operation of the memory cell.

25. A semiconductor device according to claim 12, wherein hot holes are injected into the nitride film for erasing operation of the memory cell.

26. A semiconductor device according to claim 14, wherein hot electrons are injected into the ONO film for programming operation of the memory cell.

27. A semiconductor device according to claim 14, wherein hot holes are injected into the ONO film for erasing operation of the memory cell.

28. A semiconductor device according to claim 18, wherein hot electrons are injected into the ONO film for programming operation of the memory cell.

29. A semiconductor device according to claim 18, wherein hot holes are injected into the ONO film for erasing operation of the memory cell.

* * * * *